United States Patent [19]
Nakayama

[11] Patent Number: 5,371,711
[45] Date of Patent: Dec. 6, 1994

[54] INSTRUCTION MEMORY SYSTEM FOR RISC MICROPROCESSOR CAPABLE OF PREFORMING PROGRAM COUNTER RELATIVE ADDRESSING

[75] Inventor: Takashi Nakayama, Tokyo, Japan

[73] Assignee: NEC Corporation, Tokyo, Japan

[21] Appl. No.: 204,997

[22] Filed: Mar. 3, 1994

[30] Foreign Application Priority Data
    Mar. 3, 1993 [JP] Japan ................................... 5-41644

[51] Int. Cl.[5] ............................................ G11C 13/00
[52] U.S. Cl. ............................ 361/230.03; 365/189.05; 365/230.08
[58] Field of Search ................... 365/189.01, 230.01, 365/189.03, 189.05, 189.08, 230.03, 230.06, 230.08, 231, 240

[56] References Cited
U.S. PATENT DOCUMENTS
4,694,428 9/1987 Matsumura et al. ............. 365/230.01

*Primary Examiner*—Terrell W. Fears
*Attorney, Agent, or Firm*—Whitham, Curtis, Whitham & McGinn

[57] ABSTRACT

In a memory system including a memory cell array, a row decoder and a column decoder, a first shift register receives a first value outputted from said row decoder, to output a first shifted value obtained by shifting said first value, to said memory cell array for access to said memory cell array, and a second shift register receiving a second value outputted from said column decoder, to output a second shifted value obtained by shifting said second value, to said memory cell array for access to said memory cell array. A shift control logic responds to advance of said program and an branch instruction for controlling the shift of said first and second shift registers.

8 Claims, 5 Drawing Sheets

INSTRUCTION MEMORY SYSTEM FOR RISC MICROPROCESSOR CAPABLE OF PREFORMING PROGRAM COUNTER RELATIVE ADDRESSING

BACKGROUND OF THE INVENTION

1. Field of the Invention

The present invention relates to a memory system, and more specifically to a memory system including an instruction memory, for use in a RISC (reduced instruction set computer) type microprocessor having a highly pipelined architecture.

2. Description of Related Art

Rapid advancement of a VLSI (very large scaled integrated circuit) technology and a design technique has resulted in a remarkable development of microprocessors whose performance continues to elevate and approach a superminicomputer. One of the performance elevating technologies includes a so called RISC type microprocessor, which is characterized in that, instructions that are included in an instruction set used in conventional computers and that have a high use frequency, are realized in the form of hardware for the purpose of increasing the precessing speed.

Figure 1A:
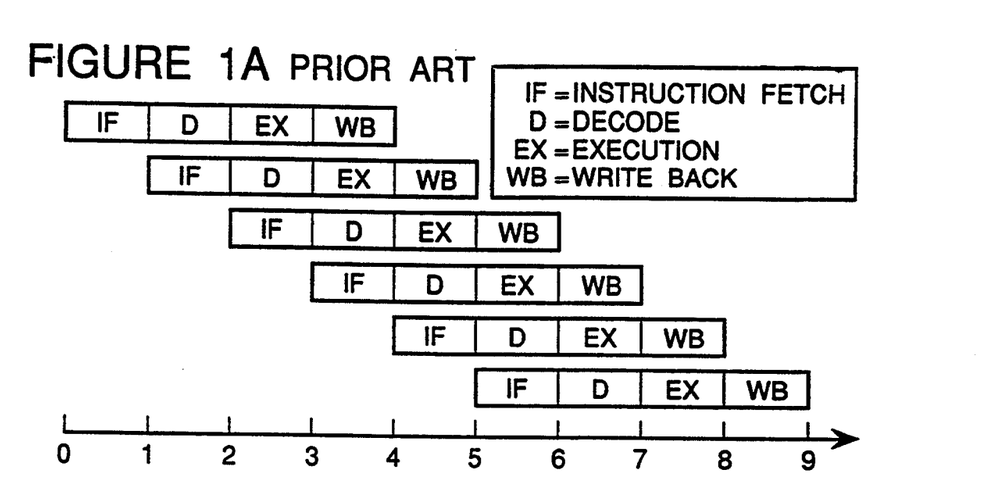
FIG. 1A illustrates a pipelined structure of a basic RISC processor.

For example, N. P. Jouppi, "The Nonuniform Distribution of Instruction-Level and Machine Parallelism and Its Effect on Performance", IEEE Transactions on Computers, Vol. 38, No. 12, December 1989, pp1645-1658, defines a superscalar system and a superpipelined system for elevating the performance of the RISC microprocessor, as follows:

Referring to FIG. 1A, there is shown a pipelined structure of a basic RISC processor, which has four stages called "Instruction Fetch" (IF), "Decode" (D), "Execute" (EX) and "Write Back" (WB), respectively. In the stage "IF", an instruction code is read from an instruction cache memory, and in the stage "D", the fetched instruction code is decoded, and necessary register files are read. In the stage "EX", an arithmetic or logic operation is performed on contents read out of the register files, and in the stage "WB", the result of arithmetic or logic operation is written back to a register file. The operation is advanced by one pipelined stage in each one clock cycle, so that one instruction can be executed in each one clock cycle.

Figure 1B:
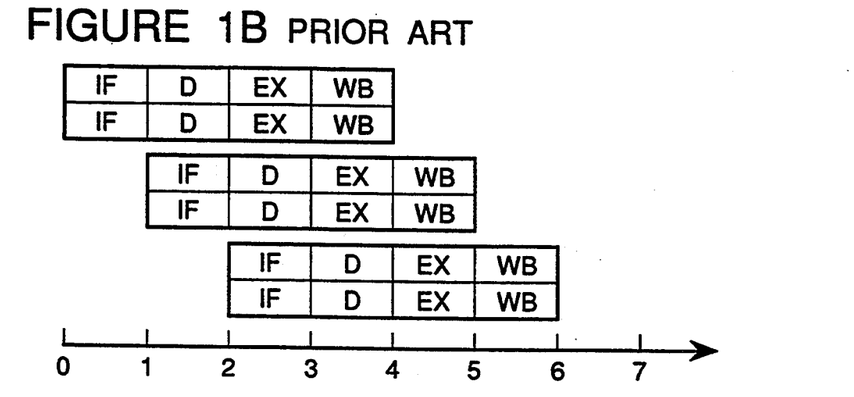
FIG. 1B illustrates a superscalar pipelined system of N=2.

The superscalar system is featured in that "N" processor units are provided so that "N" instructions can be simultaneously executed (where "N" is an integer not less than 2). FIG. 1B illustrates the superscalar system of N=2, so that two instructions are executed in each one clock cycle.

Figure 1C:
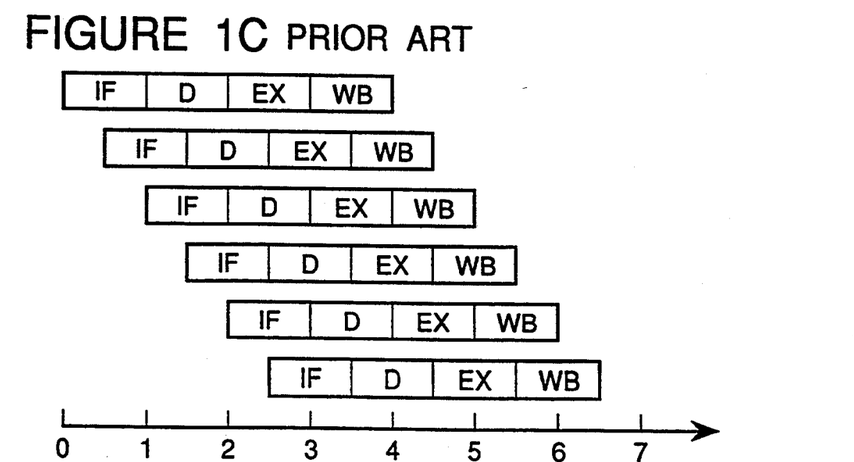
FIG. 1C illustrates a superpipelined system.

On the other hand, the superpipelined system is realized by subdividing the basic pipelined system shown in FIG. 1A by "M" (where "M" is an integer not less than 2) and shortening the period of each clock cycle to one-divided-by-"M", so that the instructions can be executed at a speed which is "M" times the speed of the basic pipelined system. FIG. 1C shows the superpipelined system of M=2. In the shown example, since the period of two clock cycles in the superpipelined system corresponds to one clock cycle of the basic pipelined system shown in FIG. 1A, although only one instruction can be executed in each one clock cycle, two instructions can be executed in the period of one clock cycle of the basic pipelined system.

The superscalar microprocessor is disadvantageous in that the amount of hardware is increased by the number of processor units increased, and therefore, the chip size is correspondingly increased. In this connection, the superpipelined microprocessor is convenient in that it can realized by addition of only a small amount of hardware such as addition of pipelining registers and some control logic circuits.

However, the superpipelined system has a problem in an incrementer for a program counter.

Figure 2:
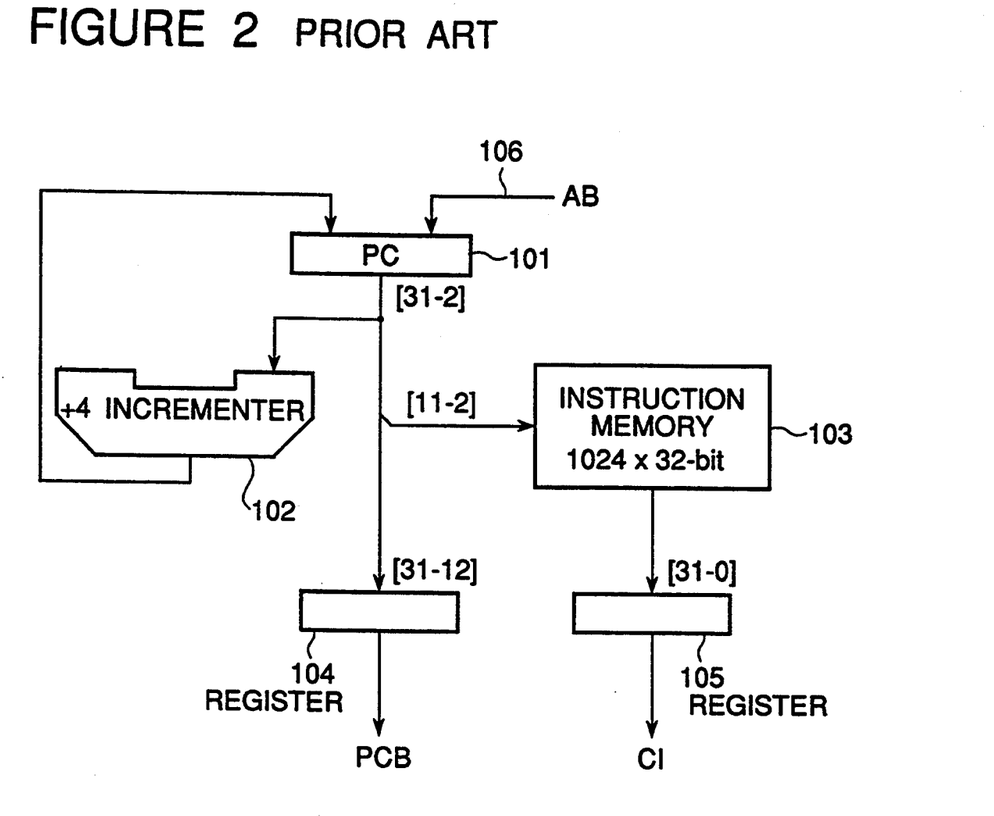
FIG. 2 illustrates a diagrammatic construction of a conventional memory system provided at the instruction fetch stage in a basic RISC microprocessor in the prior art.

Referring to FIG. 2, there is illustrated a construction of a conventional memory system provided at the basic pipelined stage "IF" in a 32-bit RISC microprocessor in the prior art. As shown in FIG. 2, the shown conventional memory system includes a 30-bit program counter (PC) 101, a 30-bit incrementer 102 associated to the program counter 101, an instruction memory 103 of 1024 words×32 bits receiving, as an address, least significant bits of the program counter 101, a 30-bit pipelining register 104 latching an output of the program counter 101, and a 32-bit pipelining register 105 latching an output of the instruction memory 103.

Now, operation of the shown conventional memory system will be described.

Since a word length of each instruction is 32 bits (4 bytes), an address for an instruction word has two least significant bis of ceaseless "0". Therefore, as mentioned above, each of the program counter 101, the incrementer 102, the register 104 and a branch address AB supplied to the program counter 101 has the word length of 30 bits, by cutting off the two least significant bis of ceaseless "0".

Assuming that the program is being sequentially executed in order, the program counter 101 is incremented +4 by +4 by the output of the incrementer 102, since the two least significant bis of the address are "0". By using the output (12 least significant bis) of the program counter 101 as the address, an instruction word is read from the instruction memory 103 and outputted to the register 105.

On the other hand, when a branch instruction is executed, a branch destination address is generated on the basis of the registers 104 and 105 by action of hardware of the stage "D" (Decode) and its downstream stage(s). Ordinarily, the branch instruction is a program counter relative addressing. Namely, the branch destination address is calculated by adding an offset value included in the instruction code, namely, in the output of the register 105, to the value of the program counter 101, namely, the output of the register 104. When the branch is executed, the branch destination address is supplied to the program counter 101 as the branch address "AB".

Here, consider that the basic pipelined structure shown in FIG. 2 is modified to the superpipelined structure of N=2. Modification of the instruction memory 103 into the superpipelined structure can be realized by a self-resetting circuit configured to detect arrival of data, to perform an operation for the data and to return to a standby condition after completion of the operation. This self-resetting circuit is disclosed in for example, T,I, Chappell et al, "A 2-ns Cycle, 3.8-ns Access 512-kb CMOS ECL SRAM with a Fully Pipelined Architecture". IEEE Journal of Solid-State Circuits, Vol. 26, No.11, November 1991, pp1577-1585.

However, it is not possible to modify the incrementer 102 into the superpipelined structure. Even if a pipelining register is inserted into the incrementer 102 so as to realize the superpipelined structure, the incrementing can be executed only one time per two clock cycles. It is impossible for 30 bits to be incremented in one clock cycle, because addition of 32 bits require two clock cycles since the execution of operation (EX) needs two stage.

For example, JP-A-57-027477 discloses a memory which makes it possible to access consecutive addresses at a high speed with using no incrementer. More specifically, a nibble mode access of a DRAM (dynamic random access memory) is performed by causing a shift register to temporarily receive an output of a Y (column) decoder for the purpose of increasing the consecutive address access speed.

It is sure that this system enables a high speed consecutive address access with no incrementer. However, for performing the branch instruction of the program counter relative addressing, the incremented value of the program counter is necessary.

As will be apparent, for realizing the superpipelined microprocessor, it is necessary to fulfill both of the two conditions, namely, the fact that the instruction memory can be successively accessed at each clock cycle, and the fact that the program counter incremented at each clock cycle is required for the branch instruction. However, there is no means which can simultaneously fulfill both of the two conditions.

SUMMARY OF THE INVENTION

Accordingly, it is an object of the present invention to provide an instruction memory system for use in a RISC pipelined microprocessor, which has overcome the above mentioned defect of the conventional one.

Another object of the present invention is to provide an instruction memory system for use in a RISC pipelined microprocessor, capable of fulfilling both of the condition that the instruction memory can be successively accessed at each clock cycle, and the condition that the program counter incremented at each clock cycle is required for the branch instruction.

The above and other objects of the present invention are achieved in accordance with the present invention by a memory system including a memory cell array having $2^H$ rows and $2^L$ columns (where "H" and "L" are positive integer), the memory cell array having a program stored in consecutive addresses successively numbered in accordance with the order of the program, a row decoder receiving and decoding "H" most significant bits of an address signal for designating the consecutive addresses of the memory cell array, for designating a row of the memory cell array, a column decoder receiving and decoding "L" least significant bits of the same address signal for designating a column of the memory cell array, a first shift register of $2^H$ bits receiving a first value constituted of an output of the row decoder, for outputting a first shifted value obtained by shifting the first value, a second shift register of $2^L$ bits receiving a second value constituted of an output of the column decoder, for outputting a second shifted value obtained by shifting the second value, and a shift control means responding to advance of the program and an branch instruction for controlling the shift of the first and second shift registers.

The above and other objects, features and advantages of the present invention will be apparent from the following description of preferred embodiments of the invention with reference to the accompanying drawings.

DESCRIPTION OF THE PREFERRED EMBODIMENTS

Figure 3:
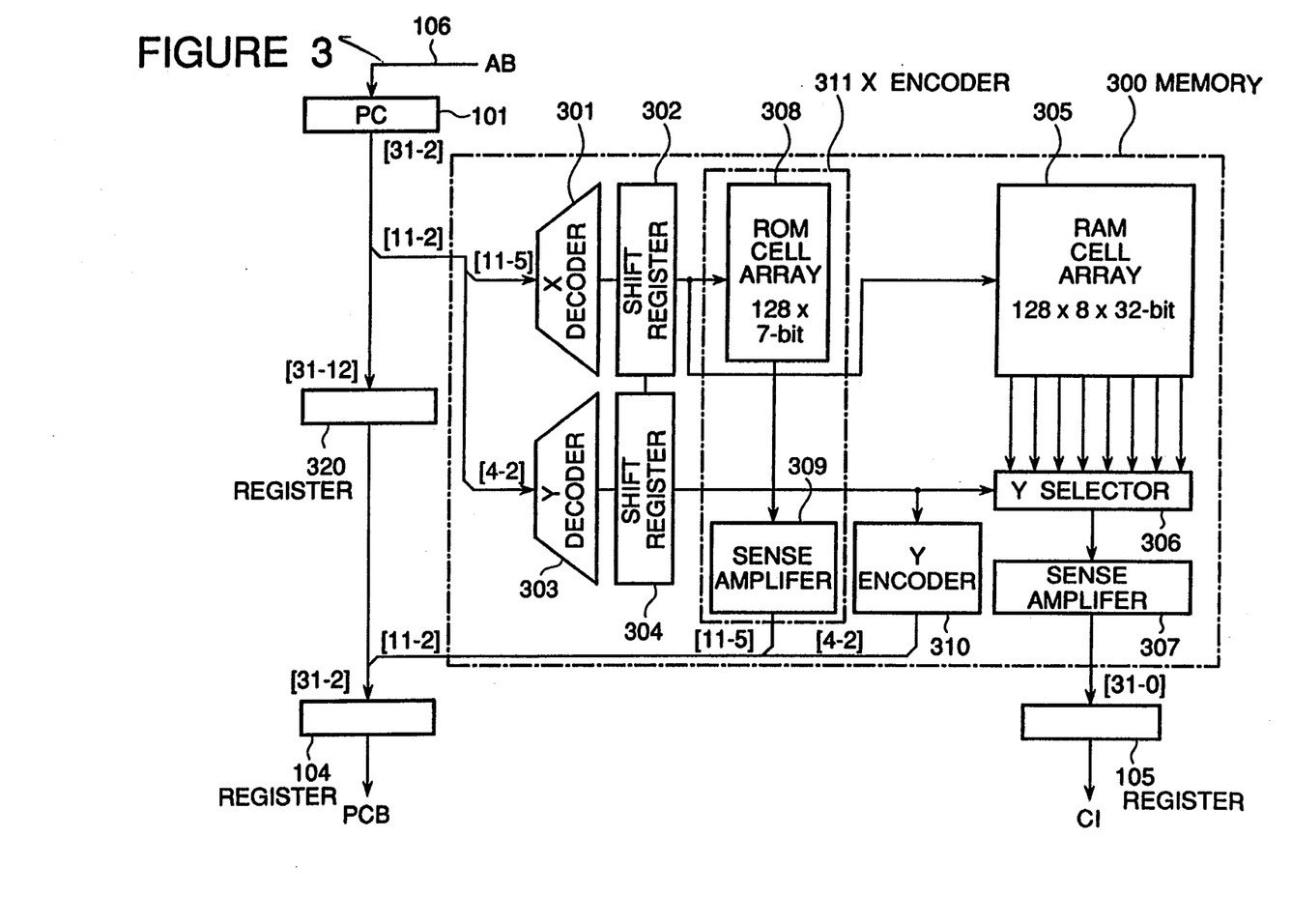
FIG. 3 is a block diagram of a first embodiment of the memory system in accordance with the present invention.

Referring to FIG. 3, there is shown a block diagram of a first embodiment of the memory system in accordance with the present invention. The shown embodiment is to be incorporated in the instruction fetch stage of the 32-bit RISC microprocessor. In FIG. 3, therefore, elements corresponding or similar to those shown in FIG. 2 are given the same Reference Numerals.

The memory system shown in FIG. 3 includes a program counter PC 101 and registers 104 and 105 similar to the conventional example. The memory system also includes, a pipelined instruction memory 300 of 1024 words×32 bits receiving least significant bits of the program counter PC 101 as an address, in place of the instruction memory 103 in the conventional example, and a pipelining 20-bit register 320 for latching most significant bits of the program counter PC 101.

The memory 300 includes an X decoder 301 receiving most significant bits of the address supplied to the memory 300, a shift register 302 for latching an output of the X decoder 301, a Y decoder 303 receiving least significant bits of the address supplied to the memory 300, a shift register 304 for latching an output of the Y decoder 303, a RAM (random access memory) cell array 305 of 128 rows (X), 8 columns (Y) and 32 bits, the 128 rows being accessed by an output of the shift register, a Y selector 306 controlled by an output of the shift register 304 so as to select one of the eight columns of the RAM cell 305, a sense amplifier group 307 for amplifying an output of the Y selector 306, a Y encoder 310 for encoding the output of the shift register 304 into a 3-code code, and an X encoder 311 for encoding the output of the shift register 304 into a 7-bit code. The X encoder 311 includes a ROM (read only memory) cell array 308 of 128 rows (X), 7 bits, the 128 rows being accessed by the output of the shift register 302, and a sense amplifier 309 for amplifying an output of the ROM cell array 308.

Similarly to the conventional example, since a word length of each instruction is 32 bits (4 bytes), two least significant bits of an address for an instruction word are ceaselessly "0". Therefore, as mentioned above, each of the program counter PC 101, the register 104 and a branch address AB supplied to the program counter PC 101 has the word length of 30 bits, by cutting off the two least significant bis of ceaseless "0".

In the memory 300, the shift registers 302 and 304 functions as a pipelining registers, which constitute a pipelined memory which can be read in two clock cycles as a whole.

Figure 4:
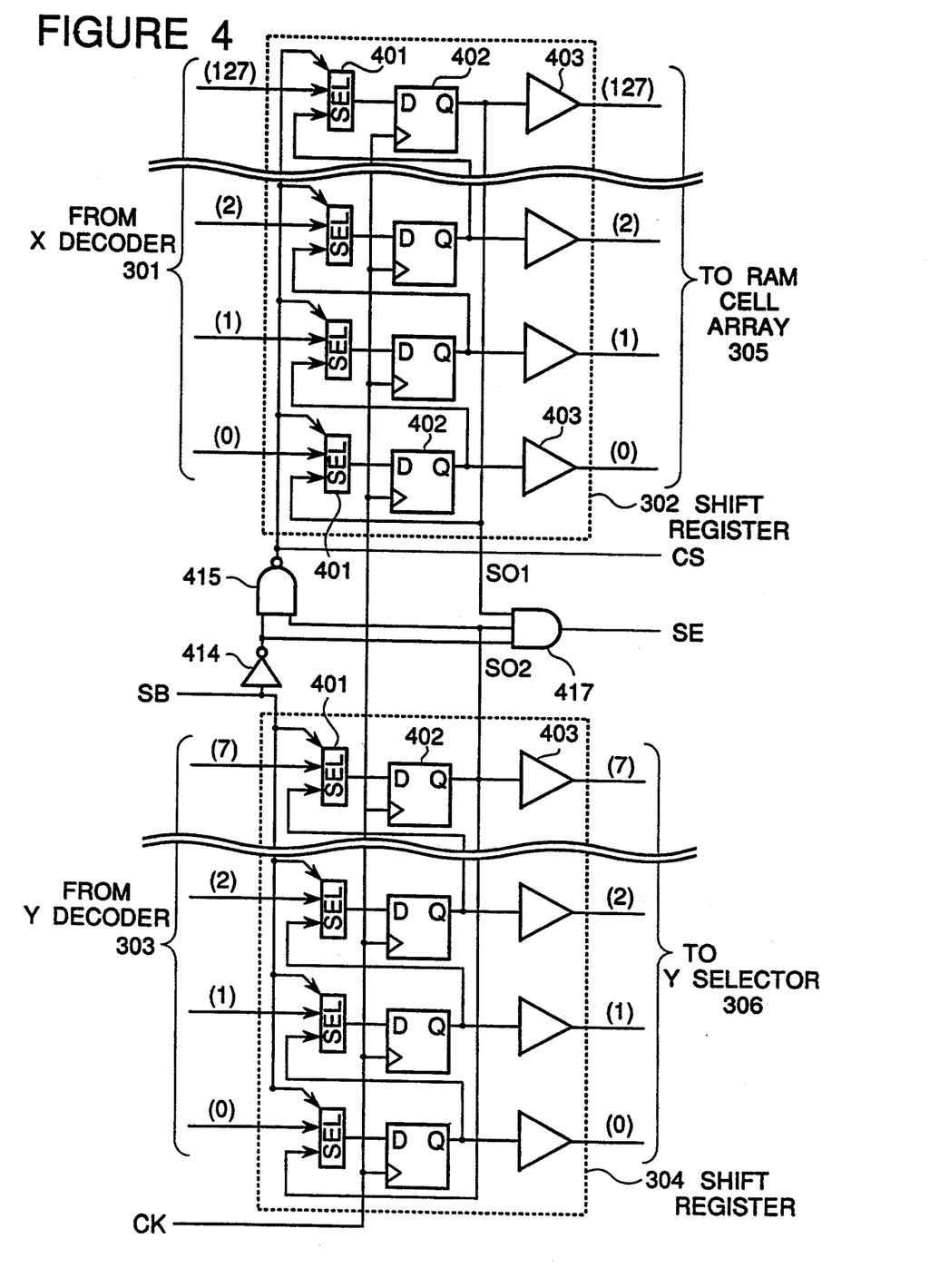
FIG. 4 is logic circuit diagram of a shift register incorporated in the memory system shown in FIG. 3.

Referring to FIG. 2, there is shown a logic circuit diagram illustrating a construction of the shift registers 302 and 304.

The shift registers 302 and 304 are 128 bits and 8 bits, respectively. Each of the shift registers 302 and 304 includes a number of unitary stage circuits having the same construction and corresponding to one bit. Each of the unitary stage circuits has a selector receiving the corresponding one bit of the corresponding decoder 301 or 302 and an output of an adjacent less significant stage of the shift register for outputting a selected one, an edge-triggered flipflop for latching an output of a corresponding selector 401 in synchronism with a clock CK, and a driver 403 receiving an output of a corresponding flipflop for selecting a word line of the RAM cell array 305 or for selecting the Y-selector 306. Therefore, in each shift register, a signal is shifted toward to more significant bit, for example, from a 0th bit to a 1st bit, from the 1st bit to a 2nd bit, etc. However, the signal shifted out from the most significant bit, a 127th bit of the shift register 302 and a 7th bit of the shift register 304, is returned to the 0th bit. For this purpose, an output of the most significant stage circuit in each shift register is connected to the selector 401 of the least significant stage circuit of the same shift register.

The selectors 401 of the decoder 303 are directly controlled by a branch signal SB indicative of a branch at the time of executing a branch instruction. On the other hand, the selectors of the decoder 302 are controlled by a shift control signal CS, which is generated by an NAND gate 415 having a first input connected to receive a shift-out signal SO2 generated from the output of the most significant stage circuit of the shift register 304 and a second input connected to an output of an inverter 414 having its input receiving the branch signal SB. Furthermore, there is provided a three-input AND gate 417 having a first input connected to receive the shift-out signal SO2 generated from the output of the most significant stage circuit of the shift register 304, a second input connected to receive a shift-out signal SO1 generated from the output of the most significant stage circuit of the shift register 302, and a third input connected to the output of the inverter 414. This AND gate 417 detects that an incrementing is incremented from a last address of the memory 300, and generates an error signal SE.

Now, operation of the first embodiment will be described.

Differently from the conventional example, the value of the program counter PC 101 does change and is maintained as it is. The shift registers 302 and 304 are so configured that only one bit corresponding to row or column to be accessed is made to "1", and the other bits are "0". By the output signal of the shift register 302, one row of the 128 rows of the RAM cell array 305 is selected, so that contents of RAM cells of 8 columns×32 bits included in the selected row are outputted to the bit lines. One column of the eight columns is selected by the Y selector, and the selected contents are amplified by the sense amplifier 307, and outputted from the sense amplifier 307.

When the program is consecutively executed, the branch signal SB is maintained at "0". In the shift register 304, the signal "1" is sequentially shifted bit by bit from a less significant bit toward a more significant bit. Accordingly, the Y selector is sequentially switched in response to successive clocks, so that contents (of a selected row) of the RAM cell array corresponding to consecutive addresses are read out.

when the most significant column is selected in the Y selector 306, the shift-out signal SO2 is brought to "1", and therefore, the shift control signal CS is brought to "0". As a result, the shift register 302 is shifted one bit in a next clock cycle, and a more significant row next to the selected row of the RAM cell array 305 is newly selected. On the other hand, the 0th bit of the shift register is brought to "1" as the result of one circulation, so that a first column is selected by the Y selector 306. Thus, contents of the memory 300 corresponding to consecutive addresses are read out. The readout contents are latched in the register 105, and transferred to a next pipelined stage.

On the other hand, when a branch instruction is executed, a branch destination address AB is calculated on the basis of the output of the registers 104 and 105 by action of hardware of the pipelined stage "D" (Decode) and its downstream stage(s). Ordinarily, the branch instruction is a program counter relative addressing. Namely, the branch destination address AB is calculated by adding an offset value included in the instruction code CI, namely, in an output of the register 105, to an output PCB of the register 104. When the branch is executed, the branch destination address AB is supplied to the program counter PC 101 through a signal line 106.

Of the content of the program counter PC 101, 10 least significant bits (11th bit to 2nd bit, since 1st and 0th bits are cut off as mentioned above) are supplied to the memory 300. Of the 10 least significant bits supplied to the memory 300, 4th to 2nd bits are supplied to the Y decoder 303, and the 11th to 5th bits are supplied to the X decoder 301. In the case of the branch, the branch signal SB is "1", and therefore, the shift control signal CS becomes "1". Accordingly, the shift operation of the shift registers 302 and 304 is inhibited, and therefore, the output value of the Y decoder 303 is supplied to the shift register 304, and the output value of the X decoder 301 is supplied to the shift register 302. Thus, from the RAM cell array 305, a content of the column designated by the output of the Y decoder 303 in the row designated by the output of the X decoder 301 is read out by the Y selector 306, and then, amplified by the sense amplifier 307 and latched in the register 105.

Now, reconstruction of the program counter 101 will be explained. The 8-bit value of the shift register 304 is encoded into a 3-bit code by the Y encoder 310. The following is a logic of the Y encoder 310.

| INPUT | | | | | | | | OUTPUT | | |
|---|---|---|---|---|---|---|---|---|---|---|
| 7 | 6 | 5 | 4 | 3 | 2 | 1 | 0 | 4 | 3 | 2 |
| 0 | 0 | 0 | 0 | 0 | 0 | 0 | 1 | 0 | 0 | 0 |
| 0 | 0 | 0 | 0 | 0 | 0 | 1 | 0 | 0 | 0 | 1 |
| 0 | 0 | 0 | 0 | 0 | 1 | 0 | 0 | 0 | 1 | 0 |
| 0 | 0 | 0 | 0 | 1 | 0 | 0 | 0 | 0 | 1 | 1 |
| 0 | 0 | 0 | 1 | 0 | 0 | 0 | 0 | 1 | 0 | 0 |
| 0 | 0 | 1 | 0 | 0 | 0 | 0 | 0 | 1 | 0 | 1 |
| 0 | 1 | 0 | 0 | 0 | 0 | 0 | 0 | 1 | 1 | 0 |
| 1 | 0 | 0 | 0 | 0 | 0 | 0 | 0 | 1 | 1 | 1 |

The logic expressed in the above table corresponds to that which is obtained by mutually exchanging an input and an output in the input-output conversion logic performed in the Y decoder 303.

The Y encoder 310 is in a size which can be realized by a random logic, but the X encoder 311 is composed of the ROM cell array 308 and the sense amplifier 309 as mentioned above. The X encoder 311 encodes the 128-bit output of the shift register 302 into a 7-bit code. With this arrangement, the output of the shift register 302 can be used in common to the word lines of the RAM cell array 305 and the ROM cell 305, and therefore, a necessary layout area can be reduced. The logic of the X encoder 311 is similar to that of the above table, excepting that the input is composed of 128 bits and the output is composed of 7 bits, and corresponds to that which is obtained by mutually exchanging an input and an output in the logic performed in the X decoder 301.

Thus, if the signal "1" is shifted to a more significant bit in the shift register 304, the output value of the Y encoder 310 is incremented. As mentioned above, if the signal "1" is shifted to the most significant bit in the shift register 304, the output of the Y encoder 310 then becomes "111", and the signal "1" is also shifted in the shift register 302, so that the output value of the X encoder 311 is incremented. Accordingly, an output signal PR of the memory 330, which is generated by combining the output of the Y encoder 310 and the output of the X encoder 308, is incremented in the range of 10 bits (=7 bits+3 bits). The value of this signal PR is delayed one stage, in synchronism with the output of the memory 300. The value of this signal PR is combined with the value of the register 320, which corresponds to the most significant bits of the program counter PC 101 delayed one stage, so that a combined value is supplied to the register 104. Accordingly, the output of the registers 104 and 105 becomes the content to be supplied to the stage "D", and therefore, the branch address is properly calculated in the succeeding stage(s).

Figure 5:
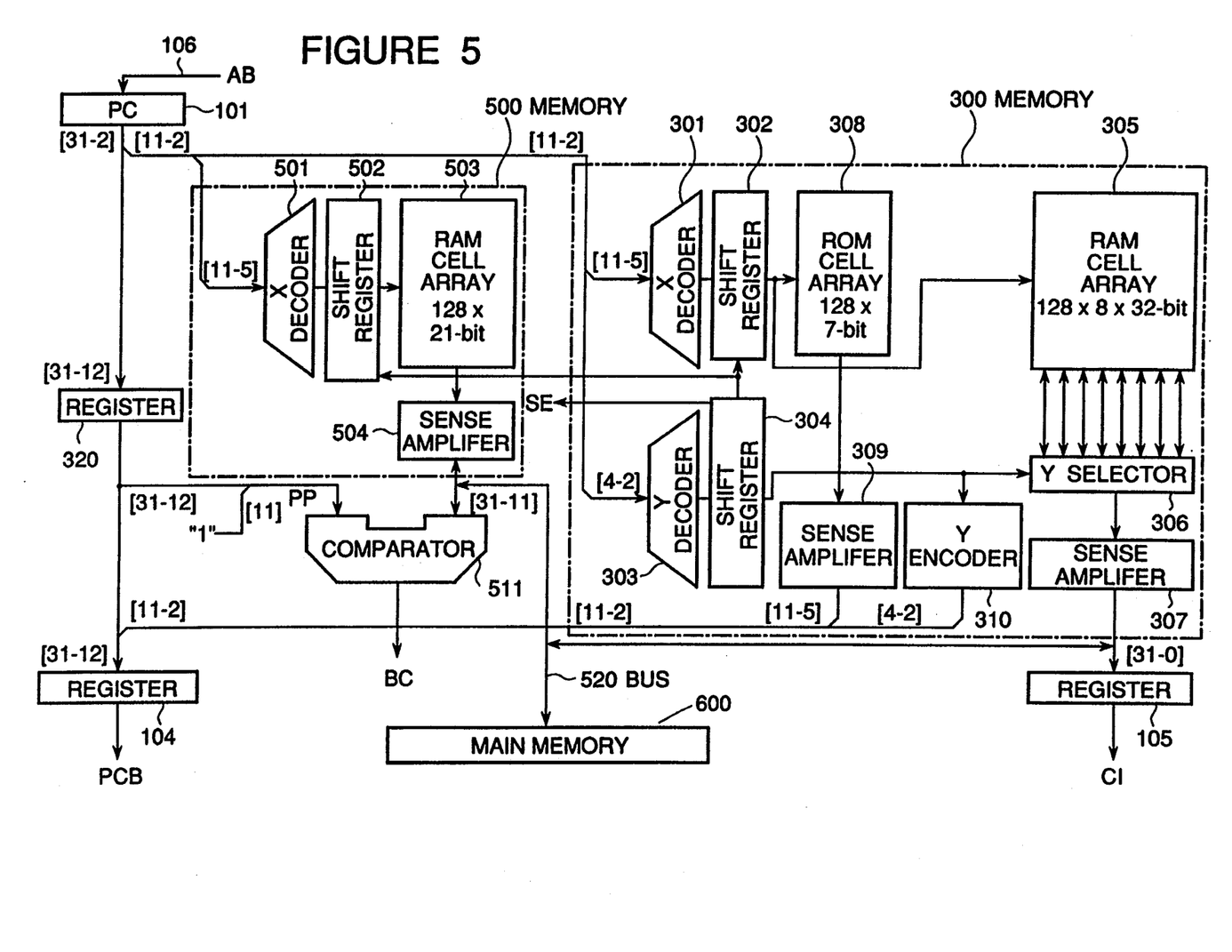
FIG. 5 is a block diagram of a second embodiment of the memory system in accordance with the present invention.

Now, a second embodiment of the memory system in accordance with the present invention will be described. FIG. 5 is a block diagram of the second embodiment of the memory system in accordance with the present invention. The second embodiment is featured in that the memory 300 is used as a data memory for an instruction cache memory, and a tag memory 500 is added so that a direct mapped cache memory having 128 blocks each having a block size of 8 words (8×32 bits) is constituted.

The point of the second embodiment different from the first embodiment in that, the second embodiment includes, in addition to the elements 101, 104, 105, 300 and 320 provided in the first embodiment, a pipelined memory 500 of 128 words×21 bits, a comparator 511 for comparing an output of a sense amplifier 502 of the memory 500 with a 21-bit signal PP obtained by adding one bit of "1" to the least significant bit of the output of the register 320 for the purpose of outputting a cache hit signal BC, and a bus 520 for data exchanging.

The memory 500 includes an X decoder 501 receiving the 11th to 5th bits of output of the program counter PC 101, a shift register 502 for latching an output of the X decoder 501 and controlled by the shift control signal CS from the shift register 304, an RAM cell array 503 of 128 words×21 bits accessed by an output of the shift register, and a 21-bit sense amplifier 504 connected to the RAM cell array 503.

Figure 6:
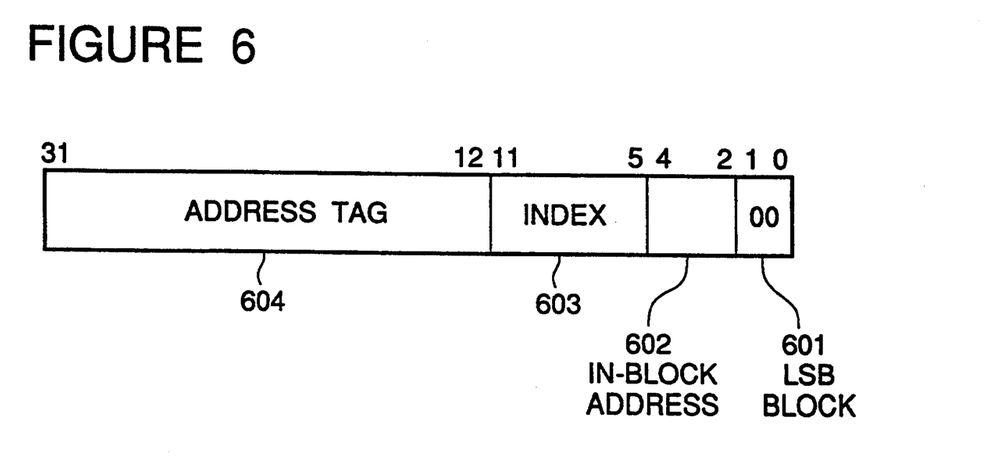
FIG. 6 is illustrate an address space in the shown embodiment.

FIG. 6 illustrates an address space of the cache memory shown in FIG. 5. 1st and 0th bits, constituting the least significant block of the address, are ceaselessly "0". 4th to 2nd bits are indicative of an in-block address. 11th to 5th bits are used as an index of the cache. 12th to 31st bits constitutes an address tag of the cache.

The RAM cell array 503 includes 128 blocks each composed of 21 bits. Each block stores an address tag composed of 20 bits and a valid bit of one bit indicative of whether or not information stored in the corresponding block is valid. The valid bit is the 11th bit, and therefore, is positioned at the same place as that of one bit of "1" added to the signal PP. Thus, the comparator 511 can detect whether or not the value of the address tag outputted from the memory 500 is equal to the tag portion of the program counter PC 101, and whether or not the valid bit outputted from the memory 500 is "1", namely, valid. Accordingly, the cache hit signal BC generated by the comparator 511 is representative of whether or not the cache is hit.

The address corresponding to the index 603 is supplied from the 11th to 5th bits of the program counter PC 101 to the X decoder 501 of the memory 500 and the X decoder 301 of the memory 300. The address corresponding to the in-block address 602 is also supplied from the 4th to 2nd bits of the program counter PC 101 to the Y decoder of the memory 300.

In the case of the branching, a new address is supplied from the decoders 301 and 302 to the shift registers 302 and 304, similarly to the first embodiment. In the case of accessing consecutive addresses, the signal "1" is shifted in the shift register 304, and a new data is consecutively outputted from the memory 300 to the register 105. While the contents in the same block are accessed, the memory 500 continues to output the same value.

When the access exceeds one block, the shift control signal CS is brought to "1", and therefore, the signal "1" is shifted in each of the shift registers 302 and 502 associated to the memories 300 and 500, so that a next block is accessed.

The comparator 511 ceaselessly checks whether or not the cache content of the new block is valid. If a cache missing occurs, namely, if the cache hit signal BC is "0", the content of the block newly accessed is updated by transferring a corresponding content from a main memory 600 through the data bus 520 and through the sense amplifier 307 and the Y selector 306 to the RAM cell array 305 and through the sense amplifier 504 to the RAM cell array 503. At this time, for incrementing the in-block address, it is possible to use the shift register 304 in the memory 300.

When the index 603 exceeds the final index, namely, the 127th block in the memory access, the tag portion of the program counter 101, namely, the address tag must be incremented. This can be known from the error signal SE. When the error signal SE is "1", a control circuit (not shown) of the processor generates a virtual branch instruction, so that the value AB of the program counter incremented in an branch address generation circuit is supplied through the signal line 106. At this time, there occurs the same time penalty as when a branch instruction is executed. Namely, a pipeline stall of a few clock cycles occurs. However, the probability of occurrence is as extremely small as less than 1/128, and therefore, the influence to performance can be ignored.

As mentioned above, the present invention makes it possible to modify the instruction memory into a pipelined structure by inserting the shift register into the instruction memory, and also to perform both of the pipelined access and the consecutive access. The incrementer is omitted by adding the encoder for reconstructing the value of the program counter, and therefore, the operating frequency of the microprocessor can be greatly elevated.

Accordingly, since the memory system in accordance with the present invention requires no incrementer which is a hindrance in increasing the clock frequency. Therefore, it is possible to increase the number of stages in the pipelined structure. Namely, it is possible to easily realize a superpipelined structure having a microprocessor frequency increased two or more times, by pipelining the instruction memory into two or more stages.

The invention has thus been shown and described with reference to the specific embodiments. However, it should be noted that the present invention is in no way limited to the details of the illustrated structures but changes and modifications may be made within the scope of the appended claims.

In the above mentioned embodiment, the instruction memory has been pipelined into two stages. However, the instruction memory can be pipelined into three or more stages by further adding one or more pipelining registers.

In addition, in the tag memory of the second embodiment, the bit lines can be shortened by using a Y selector, so that the operation can be speeded up.

Furthermore, one X decoder and one shift register can be used in common to the data memory and the tag memory, so that the whole is laid out as one memory.

I claim:

1. A memory system including a memory cell array having $2^H$ rows and $2^L$ columns (where "H" and "L" are positive integer), said memory cell array having a program stored in consecutive addresses successively numbered in accordance with the order of said program, a row decoder receiving and decoding "H" most significant bits of an address signal for designating the consecutive addresses of said memory cell array, for designating a row of said memory cell array, a column decoder receiving and decoding "L" least significant bits of the same address signal for designating a column of said memory cell array, a first shift register of $2^H$ bits receiving a first value constituted of an output of said row decoder, for outputting a first shifted value obtained by shifting said first value, a second shift register of $2^L$ bits receiving a second value constituted of an output of said column decoder, for outputting a second shifted value obtained by shifting said second value, and a shift control means responding to advance of said program and an branch instruction for controlling the shift of said first and second shift registers.

2. A memory system claimed in claim 1 wherein said shift control means is configured to respond to the advance of said program so as to shift said first and second shift registers so that said first and second shift values are consecutively shifted to more significant values, and said shift control means is also configured to respond to a branch signal instructing execution of said branch instruction so as to stop the shifting operation of said first and second shift registers and to cause said first and second shift registers to store said first and second values, respectively, and wherein when said first and second shift values reach their maximum values, said first and second shift registers generate first and second maximum value reaching signals, respectively.

3. A memory system claimed in claim 2 wherein each of said first and second shift registers includes a plurality of stages each of which includes a selector for receiving a corresponding bit of said first or second value and a bit output of an adjacent less significant bit state for outputting a selected bit, and a flipflop latching said selected bit from said corresponding selector in response to a clock signal, said flipflop outputting the latched bit to said memory cell array or a column selector associated to said memory cell array.

4. A memory system claimed in claim 3 further including a row encoder receiving said first shifted value for encoding said first shifted value into a "H"-bit code in accordance with an input-output conversion logic reverse to an input-output conversion logic performed in said row decoder, and a column encoder receiving said second shifted value for encoding said second shifted value into a "L"-bit code in accordance with an input-output conversion logic reverse to an input-output conversion logic performed in said column decoder.

5. A memory system claimed in claim 1 wherein each of said first and second shift registers includes a plurality of stages each of which includes a selector for receiving a corresponding bit of said first or second value and a bit output of an adjacent less significant bit state for outputting a selected bit, and a flipflop latching said selected bit from said corresponding selector in response to a clock signal, said flipflop outputting the latched bit to said memory cell array or a column selector associated to said memory cell array.

6. A memory system claimed in claim 5 further including a row encoder receiving said first shifted value for encoding said first shifted value into a "H"-bit code in accordance with an input-output conversion logic reverse to an input-output conversion logic performed in said row decoder, and a column encoder receiving said second shifted value for encoding said second shifted value into a "L"-bit code in accordance with an input-output conversion logic reverse to an input-output conversion logic performed in said column decoder.

7. A memory system claimed in claim 1 further including a row encoder receiving said first shifted value for encoding said first shifted value into a "H"-bit code in accordance with an input-output conversion logic reverse to an input-output conversion logic performed in said row decoder, and a column encoder receiving said second shifted value for encoding said second shifted value into a "L"-bit code in accordance with an input-output conversion logic reverse to an input-output conversion logic performed in said column decoder.

8. A memory system including a memory cell array having a program stored in consecutive addresses successively numbered in accordance with the order of said program, a row decoder receiving and decoding a first portion of an address signal for designating the consecutive addresses of said memory cell array, for designating a row of said memory cell array, a column decoder receiving and decoding a second portion of the same address signal for designating a column of said memory cell array, a first shift register receiving a first value outputted from said row decoder, for outputting a first shifted value obtained by shifting said first value, to said memory cell array for access to said memory cell array, a second shift register receiving a second value outputted from said column decoder, for outputting a second shifted value obtained by shifting said second value, to said memory cell array for access to said memory cell array, and a shift control means responding to advance of said program and an branch instruction for controlling the shift of said first and second shift registers.

* * * * *